(12) United States Patent
Pan

(10) Patent No.: US 7,336,129 B2
(45) Date of Patent: Feb. 26, 2008

(54) ANALOG AMPLITUDE DETECTOR

(75) Inventor: Meng-An Pan, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 96 days.

(21) Appl. No.: 11/338,068

(22) Filed: Jan. 24, 2006

(65) Prior Publication Data

US 2007/0170989 A1 Jul. 26, 2007

(51) Int. Cl.
*H03F 3/45* (2006.01)
(52) U.S. Cl. ..................................... 330/257; 330/261
(58) Field of Classification Search ................ 330/257, 330/261, 252
See application file for complete search history.

(56) References Cited

U.S. PATENT DOCUMENTS

| 4,607,232 | A  | * | 8/1986  | Gill, Jr. ..................... 330/255 |
| 4,661,779 | A  | * | 4/1987  | Okamoto .................... 330/253 |
| 6,559,719 | B2 | * | 5/2003  | Sakuragi .................... 330/252 |
| 6,642,787 | B1 | * | 11/2003 | Souetinov et al. .......... 330/252 |

* cited by examiner

*Primary Examiner*—Henry Choe

(57) ABSTRACT

A circuit includes at least two transistors arranged to form a current mirror, at least two transistors operatively coupled to the current mirror, where the transistors are arranged to form a differential pair amplifier, and a follower transistor operatively coupled to the current mirror and to the differential pair. The transistors of the differential pair, the current mirror, and the follower transistor are operatively coupled such that during operation an amplitude of a signal output from the follower transistor is proportional to an amplitude of an signal input into the differential pair.

19 Claims, 6 Drawing Sheets

ANALOG AMPLITUDE DETECTOR

TECHNICAL FIELD

This description relates to an analog amplitude detector, and, in particular, to a highly stable, analog amplitude detector for measuring an oscillating analog signal amplitude.

BACKGROUND

Amplitude detector circuits have been developed for measuring oscillating analog signal amplitudes. Often, where the impedance at which the amplitude is measured is known, a measurement of the signal amplitude can be used to measure the signal power. Thus, under such circumstances the amplitude detector circuit can also be a power meter. For example, in a mobile telephone, smart phone, bluetooth device, or any other wireless device, the power of a radio frequency ("rf") signal transmitted from the wireless device to a base station can be monitored and controlled to maintain the output power close to the maximum allowable power. Similarly, the power of an rf signal received by a wireless device can be amplified, monitored, and controlled to provide reliable reception of the signal.

Many amplitude detector circuits rely on a rectifying diode to measure the amplitude of the analog signal. However, the gain of the rectifying diode often generally is temperature-dependent, so the accuracy of a amplitude measurement made with such a circuit may vary with temperature. Moreover, the accuracy of amplitude detector circuits that rely upon solid state devices, such as transistors, can depend on the temperature of the devices, variations in the performance parameters of individual devices, and variations in the performance between different instances of nominally-identical devices that include such detector circuits.

SUMMARY

In a first general aspect, a circuit includes at least two transistors arranged to form a current mirror, at least two transistors operatively coupled to the current mirror, where the transistors are arranged to form a differential pair amplifier, and a follower transistor operatively coupled to the current mirror and to the differential pair. The transistors of the differential pair, the current mirror, and the follower transistor are operatively coupled such that during operation an amplitude of a signal output from the follower transistor is proportional to an amplitude of an signal input into the differential pair.

Implementations can include one or more of the following features. For example, drains of the two transistors arranged to form the differential pair can be operatively coupled to a drain of a first transistor of the current mirror, the gates of the transistors of the current mirror can be operatively coupled, and a drain of the first transistor of the current mirror can be operatively coupled to the gate of the first transistor. A drain of a second transistor of the current mirror can be operatively coupled to a drain of the follower transistor, and the drain of the follower transistor can be operatively coupled to a gate of the follower transistor. Sources of the transistors that form the differential pair can be operatively coupled to a source of the follower transistor. The transistors are MOS-type transistors or BJT-type transistors.

The circuit can further include a current source operatively coupled to the sources of the transistors that form the differential pair and to the source of the follower transistor. The circuit can further include a capacitor operatively coupled to an input of the differential pair, such that during operation an input signal is AC-coupled to a gate of a transistor of the differential pair through the capacitor. A frequency of the input signal can be greater than 1 GHz. The circuit can further include a voltage divider operatively coupled to an input of the differential pair, with the voltage divider being configured for reducing an amplitude of an input signal coupled to a gate of a transistor of the differential pair. The circuit can further include a low-pass filter operatively coupled to the follower transistor, where the low-pass filter is configured for passing a low-frequency component of a signal output from the follower transistor. The circuit can further include a voltage source configured for adding a bias voltage to the signal input into the differential pair. The circuit can further include a multiplexer configured for operatively coupling the transistors of the differential pair to different nodes within a wireless transceiver device, with the circuit being located within a chip containing the wireless transceiver.

In another general aspect, a circuit includes at least two transistors arranged to form a current mirror, a third transistor and a fourth transistor operatively coupled to the current mirror, wherein the third and fourth transistors are arranged to form a differential pair amplifier, and a follower transistor operatively coupled to the current mirror and to the differential pair. The transistors of the differential pair, the current mirror, and the follower transistor are operatively coupled such that during operation an amplitude of a signal output from the follower transistor is proportional to an amplitude of an signal input into the third transistor, while a DC signal is input into the fourth transistor.

Implementations can include one or more of the following features. For example, drains of the third and fourth transistors can be operatively coupled to a drain of a first transistor of the current mirror; gates of the transistors of the current mirror can be operatively coupled; a drain of the first transistor of the current mirror can be operatively coupled to the gate of the first transistor; a drain of a second transistor of the current mirror can be operatively coupled to a drain of the follower transistor; and the drain of the follower transistor can be operatively coupled to a gate of the follower transistor.

The circuit can further include a current source, where the sources of the third transistor, the fourth transistor, and the follower transistor are operatively coupled to each other and to the current source. The circuit can further include a capacitor operatively coupled to the third transistor, where during operation the input signal is AC-coupled to a gate of the input transistor through the capacitor. The circuit can further include a voltage divider operatively coupled to an input of the third transistor, where the voltage divider is configured for reducing an amplitude of an input signal coupled to a gate of third transistor. The circuit can further include a low-pass filter operatively coupled to the follower transistor, where the low-pass filter is configured for passing a low-frequency component of a signal output from the follower transistor. The circuit can further include a multiplexer configured for operatively coupling the third transistor to different nodes within a wireless transceiver device, where the circuit is located within a chip containing the wireless transceiver.

The details of one or more implementations are set forth in the accompanying drawings and the description below.

Other features will be apparent from the description and drawings, and from the claims.

DETAILED DESCRIPTION

Figure 1:
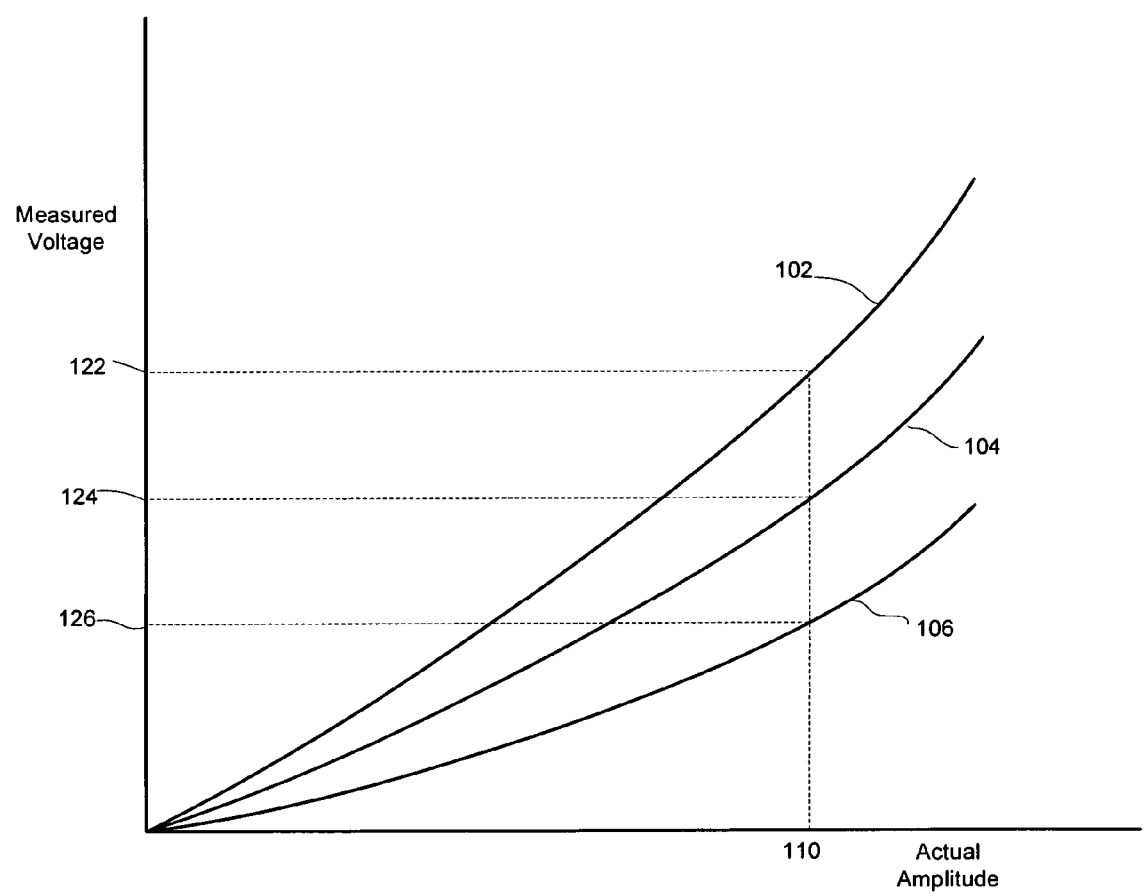
FIG. 1 is a schematic diagram of several relationships between hypothetical actual analog signal amplitudes and voltages corresponding to the analog signal amplitude measured by several amplitude detection circuits.

FIG. 1 is a schematic graph of several relationships between hypothetical analog signal amplitudes and voltages corresponding to the analog signal amplitudes measured by a hypothetical amplitude detection circuit. The frequency of the signal can be, for example, above 1 GHz, and the signal can be a radio frequency ("rf") signal. The horizontal axis of the graph corresponds to the actual signal amplitude, and the vertical axis corresponds to a voltage signal output by an amplitude detection circuit. By determining the measured output voltage, the actual signal amplitude can be determined from a curve in the graph. If the impedance, Z, at the node where the amplitude is measured by the amplitude detection circuit is known, the electrical power at this specific node can be determined using the equation, $P=(V_{rms}*V_{rms})/Re(Z)$, where P is the power, $V_{rms}$ is the root-mean-square voltage amplitude, and $Re(Z)$ is the real part of the impedance.

The curves shown in FIG. 1 show several hypothetical relationships between actual analog signal amplitudes and voltages corresponding to the analog signal amplitudes measured by an amplitude detection circuit under different operating environment, for example, different temperature, power supply, etc. Thus, under one set of performance criteria (e.g., temperature and humidity) the relationship between the actual analog signal amplitude and the voltage signal output by an amplitude detector can be given by curve 102, while under another set of performance criteria the relationship can be given by curve 104. Under still another set of performance criteria the relationship can be given by curve 106.

The different curves 102, 104, and 106 can also correspond to relationships between voltage signals output by different, nominally-identical, amplitude detection circuits and an actual signal amplitude. For example, the different amplitude detection circuits can be amplitude detection circuits on different chips that are fabricated according to the same design plans but which, nevertheless, have different performance characteristics. Thus, curves 102, 104, and 106 can correspond to relationships between an actual single frequency sinusoidal analog signal amplitude output by different chips, and the voltage signal output by amplitude detectors located on the different chips, when the different chips are operated under identical environmental conditions. The curves 102, 104, and 106 can be different due to differences in the fabrication of the different chips, which lead to performance differences in the chips.

Clearly, because an amplitude detector can output a voltage signal having different values 122, 124, and 126 that correspond to an actual analog signal amplitude, depending on the performance criteria of the circuit or that vary from chip to chip, the accuracy of the hypothetical amplitude detection circuit is not optimum.

Figure 2:
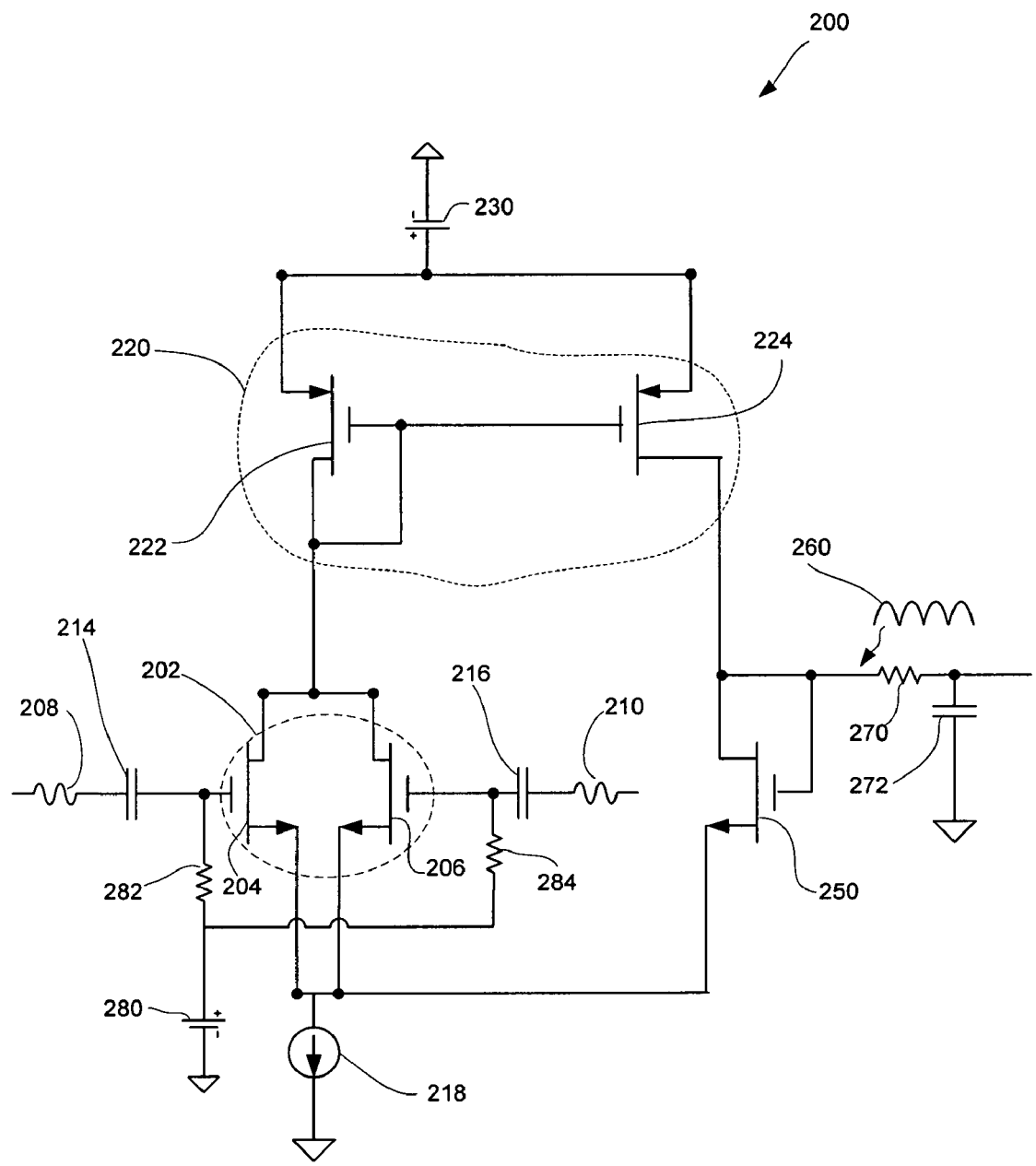
FIG. 2 is a schematic diagram of an amplitude detection circuit for measuring an analog signal amplitude.

FIG. 2 is a schematic diagram of an amplitude detection circuit 200 for measuring an analog signal amplitude, which compensates for inaccuracies described above with respect to FIG. 1. The circuit 200 uses a differential pair amplifier 202 to generate an output signal having a DC level (after subtracting some offset) that is proportional to the amplitude of the input signal. The differential pair amplifier 202 in the circuit 200 includes a matched pair of transistors 204 and 206. An analog signal 208 is received at the gate of transistor 204. Additionally, a signal 210 that has an identical frequency and amplitude as the signal 208 but that is approximately 180° out of phase with the signal 208 is fed into the gate of transistor 206. The input signals 208 and 210 can be AC-coupled to the gates of the transistors 204 and 206 through capacitors 214 and 216, respectively, when the circuit is used to measure the amplitude of a high-frequency signal. When the circuit is used to measure the amplitude of a low-frequency signal, the signal need not be AC-coupled to the inputs of the transistors 204 and 206.

The sources of the transistors 204 and 206 are coupled to a constant current source 218 that provides a bias to the sources of the transistors 204 and 206 to set the current flowing through the transistors. The drains of transistors 204 and 206 are connected to the drain of one transistor 222 within a current mirror 220 that includes matched transistors 222 and 224. The sources of the transistors 222 and 224 of the current mirror 220 are supplied with current from a power supply 230. Because the gate of transistor 222 is tied to both the drain of transistor 222 and the gate of transistor 224, the current flowing into the differential amplifier 202 is identical to the current flowing into the drain of a following transistor 250.

The following transistor 250 is matched to the transistors 204 and 206 of the differential amplifier 202, and its source is coupled to the sources of the amplifying transistors 204 and 206 in the differential amplifier. Because the gate of the following transistor 250 is tied to its drain and because the differential amplifier 202 and the following transistor 250 are each supplied with current by the matched transistors 222 and 224 of the current mirror 220, the signal 260 at the output of the circuit 200 follows a rectified version of the signal that is input into the circuit 200 at the gate of transistor 204. The output signal can also be thought of as a rectified version of the signal input at the gate of transistor 204. The transistors in the circuit 200 can be n-channel or p-channel metal-oxide semiconductor field effect transistors ("MOSFET's") or bipolar junction transistors ("BJT's").

Therefore, the circuit 200 acts like a rectifying follower circuit with a differential input, and the output signal amplitude of the circuit closely tracks the input amplitude. The circuit 200 has a relatively low temperature dependence, because any temperature-dependent variations in the performance of the active elements are compensated by the feedback in the circuit. Additionally, because of the feedback in the circuit, the output signal of the circuit is relatively unsusceptible to variations in the voltage drop between the gate and the source, $V_{gs}$, of typical transistor amplifiers. Because of the feedback mechanism, its performance is not susceptible to process variation either.

If the input signals 208 and 210 are not offset from zero, a bias voltage, $V_{bias}$, supplied from a voltage source 280 through current-limiting resistors 282 and 284 can be input to the differential pair transistors 204 and 206. If the input signals 208 and 210 are offset from zero and one of transistors 204 or 206 of the differential amplifier 202 is always turned on, the output signal 260 corresponds to a rectified version of the input signal 208 or 210. Because of the feedback in the amplitude detection circuit 200, the circuit has a low susceptibility to variations in the $V_{gs}$ of the transistors in the circuit, and therefore the performance of the circuit 200 is relatively insensitive to temperature and chip-to-chip variations.

The output signal 260 can be passed through a low pass filter that includes a resistor 270 and a capacitor 272 and that removes the AC component of the output signal 260 and produces a signal that corresponds the DC value of the rectified signal of the input signal 208 and 210. The signal downstream of the low pass filter may also include some offset voltage, $V_{offset}$, which can be determined when the circuit 200 is powered but an input signal 208 or 210 is not applied. Thus, when the circuit is power and an input signal 208 or 210 is received, the DC voltage downstream of the low pass filter is proportional to the amplitude of the incoming analog signal 208 or 210 plus some offset voltage, $V_{offset}$. If $V_{offset}$ is subtracted from this signal, a signal that proportional to the amplitude of the input signal amplitude can be determined.

The value of the $V_{offset}$ can be measured downstream of the low pass filter and stored in a memory while no oscillating input signal is applied to the gates of the transistors 204 and 206. Then, when oscillating differential inputs 208 and 210 are applied to the transistors 204 and 206, the stored value can be subtracted from the output signal downstream of the low pass filter to obtain a signal that is proportional the amplitude of the input signals 208 and 210.

Figure 3:
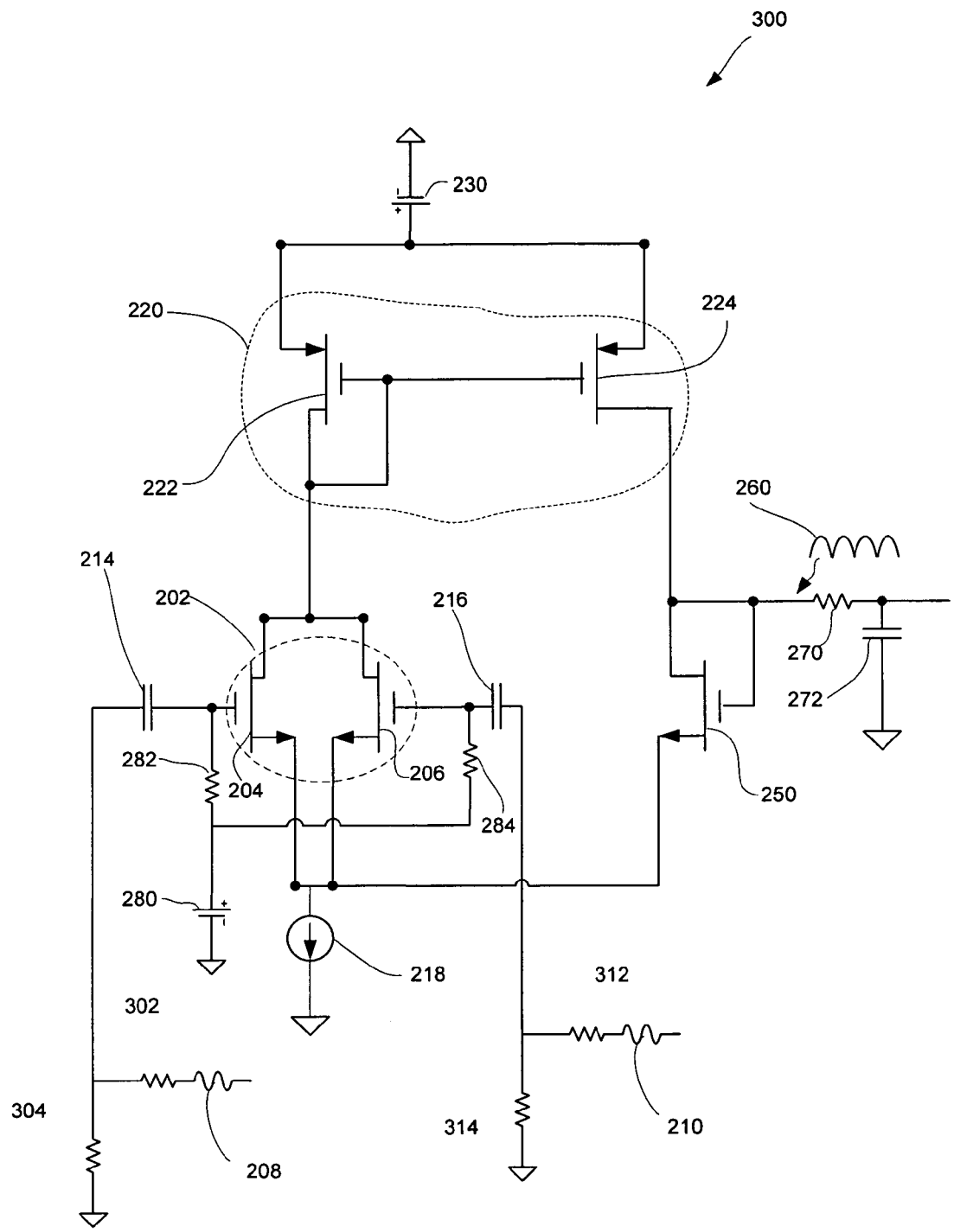
FIG. 3 is a schematic diagram of an amplitude detection circuit for measuring an analog signal amplitude.

Referring to FIG. 3, when the amplitude of the input signals 208 and 210 is too large for the circuit 300 to respond to proportionately, the input signal 208 can be passed through a voltage divider that includes resistors 302 and 304 to reduce the amplitude of the signal that is fed into transistor 204, and the input signal 210 can be passed through a voltage divider that includes resistors 312 and 314 to reduce the amplitude of the signal that is fed into transistor 206. The voltage divider can also be created with capacitors rather than with resistors. The AC-coupling capacitors 214 and 216 can be used as one of the capacitors in the voltage divider. A voltage divider could also be placed at the output of the circuit 200 to reduce the amplitude of the output signal 260.

Figure 4:
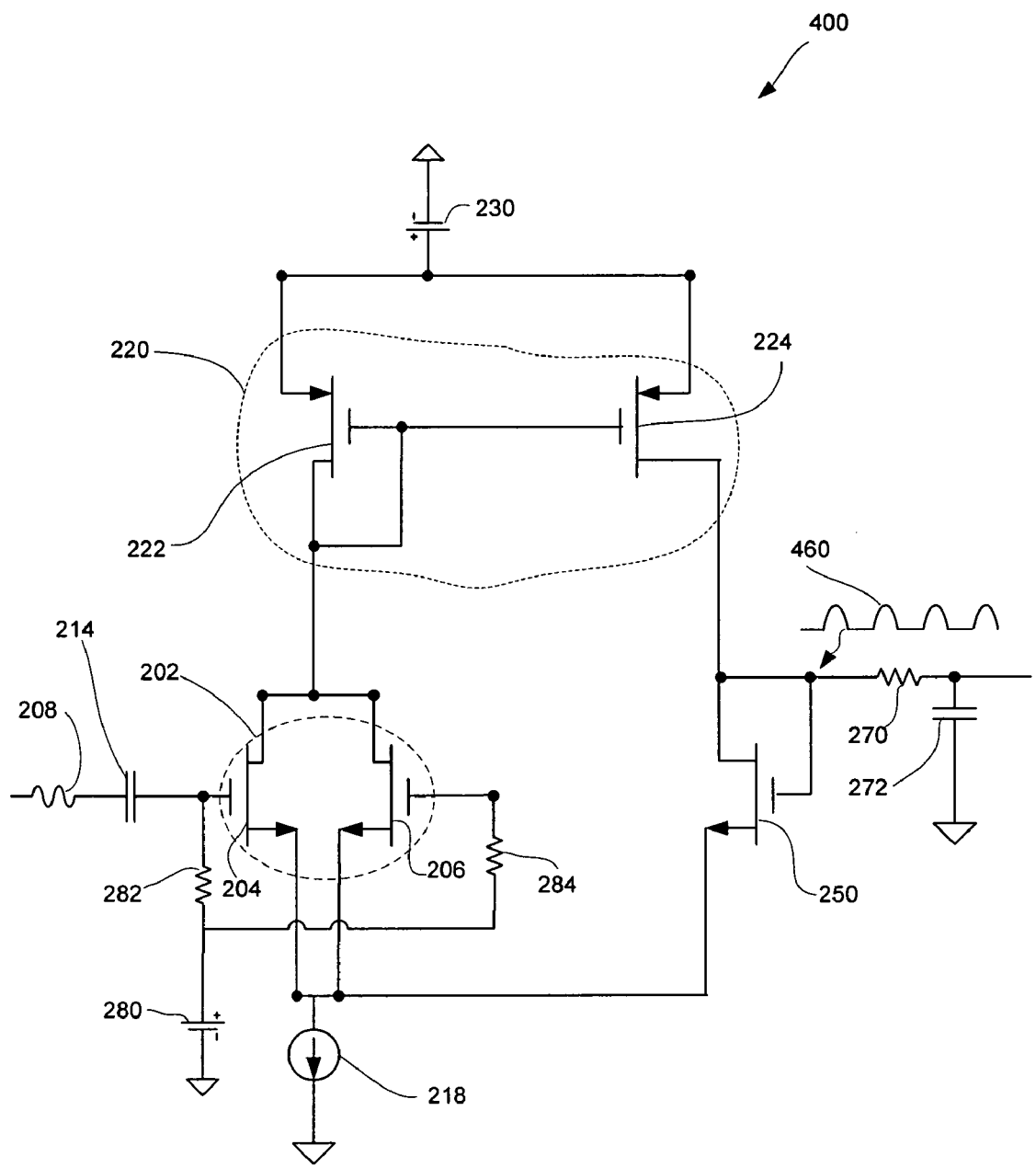
FIG. 4 is a schematic diagram of an amplitude detection circuit for measuring an analog signal amplitude.

Referring to FIG. 4, the circuit 400 can also be operated with a single ended input, rather than with two out-of-phase inputs having identical frequency and amplitude. Thus, an oscillating signal 208 and a bias voltage supplied from a voltage source 280 can be applied to one transistor 204 of the differential amplifier 202, while only the bias voltage is applied to the other transistor 206 of the differential amplifier. In this case, the output signal 460 will follow the peaks of the input signal 208 and not the troughs of the signal.

Figure 5:
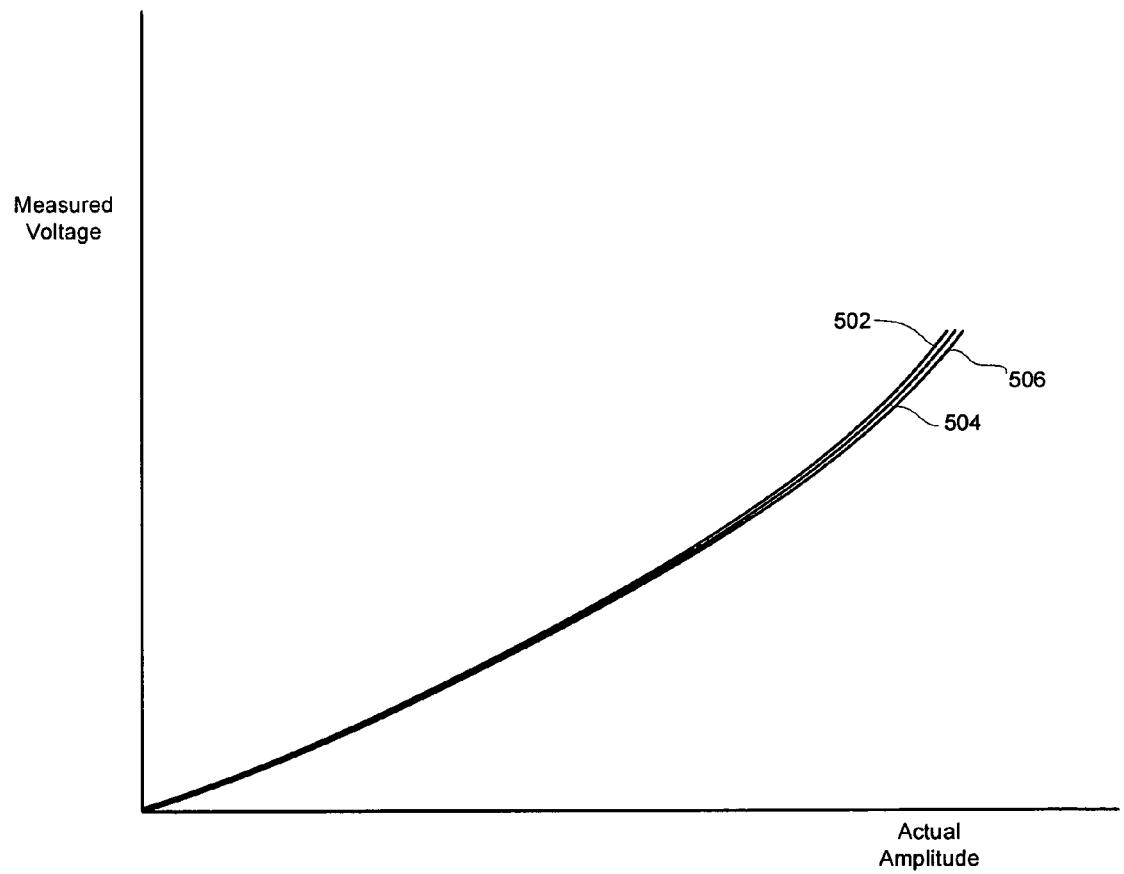
FIG. 5 is a schematic diagram of several relationships between hypothetical actual analog signal amplitudes. and voltages corresponding to the analog signal amplitude measured by different amplitude detection circuits.

FIG. 5 is a schematic graph of several hypothetical relationships between actual analog signal amplitudes and voltages corresponding to the actual amplitude measured by amplitude detection circuits 200, 300 and 400. The horizontal axis of the graph corresponds to an actual analog signal amplitude produced, and the vertical axis corresponds to a voltage signal output by an amplitude detection circuit, which is proportional to the actual analog signal amplitude. FIG. 5 can depict several relationships between hypothetical actual analog signal amplitudes and voltages corresponding to the analog signal amplitude measured by an amplitude detection circuit under different operating environments, for example, different temperatures, different power supplies, etc. Thus, under one set of performance criteria (e.g., a particular temperature and humidity) the relationship between the actual amplitude and the voltage signal output by an amplitude detector can be given by curve 502, while under another set of performance criteria the relationship can be given by curve 504. Under still another set of performance criteria the relationship can be given by curve 506. The curves start from zero because the offset voltage, $V_{offset}$, is measured before the oscillating input signal are applied and then is subtracted from the signal that is measured after the oscillating signals are applied.

The different curves 502, 504, and 506 can also correspond to relationships between voltage signals output by different, nominally-identical amplitude detection circuits and an actual analog signal amplitude. For example, the different amplitude detection circuits can be amplitude detection circuits on different chips that are fabricated according to the same design plans but which, nevertheless, have different performance characteristics. Thus, curves 502, 504, and 506 can be correspond to relationships between an actual analog signal amplitudes and the voltage amplitude signals output by amplitude detectors located on different chips, when the different chips are operated under identical environmental conditions. The curves 502, 504, and 506 can be slightly different due to differences in the fabrication of the different chips, which lead to performance differences in the chips.

Unlike the hypothetical relationships shown in FIG. 2, the relationships shown by curves 502, 504, and 506 lie close together and are intended to convey that the voltages measured by the amplitude detection circuits 200, 300, and 400 under different operating conditions or by different, nominally-identical detection circuits provide a more accurate measurement of the actual analog signal amplitude than conventional circuits.

Figure 6:
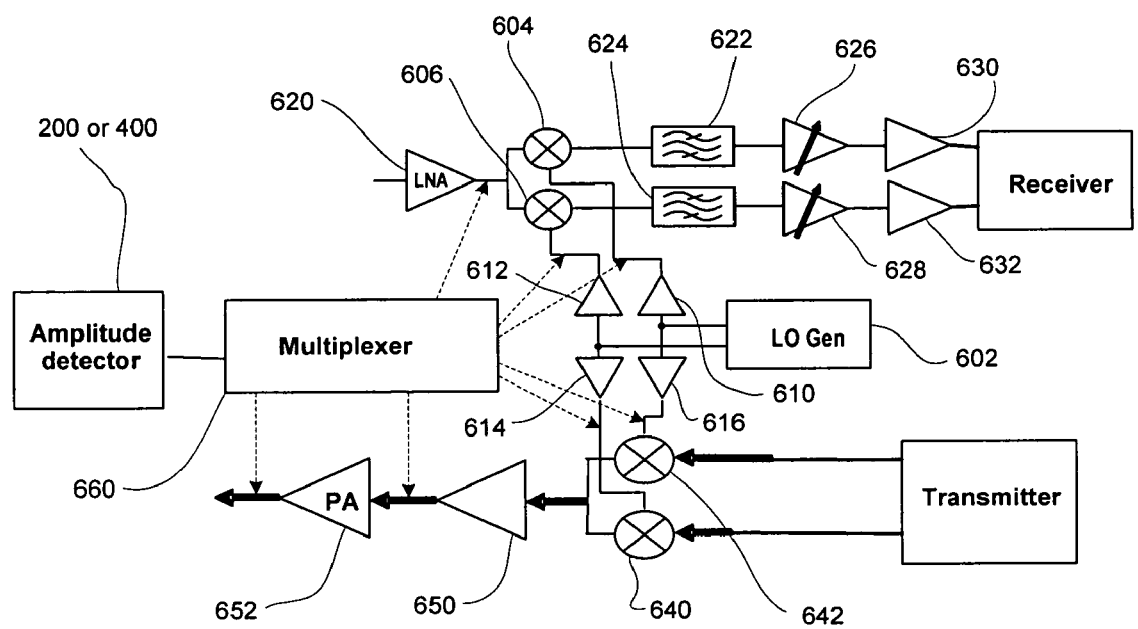
FIG. 6 is a schematic diagram of an amplitude detector used to measure analog signal amplitudes at different nodes in a transmitter/receiver circuit.

Referring to FIG. 6, a stable amplitude detection circuit 200, 300, or 400 can be used to measure the amplitude of an analog signal on a chip at several locations within an rf receiving and generating circuit 600. The circuit 600 can be used, for example, in a wireless device or in a transmitter/receiver system-on-a-chip. The circuit can include a local oscillator 602 that generates a signal having a precisely-known frequency. A signal from the local oscillator 602 can be amplified by amplifiers 610, 612, 614, and 616 and then used in the receiver and transmitter chains of the circuit 600. For example, a signal received by the device can be amplified by a low noise amplifier 620 and then mixed in mixers 604 and 606 with a signal from the local oscillator. The mixed signal can then be filtered in filters 622 and 624, and amplified by variable amplifiers 628 and 628 and fixed-gain amplifiers 630 and 632.

The output from the local oscillator 602 can be used to up-convert baseband signals to an rf frequency in mixers 640 and 642, the outputs of which can be amplified by a variable-gain amplifier 650 and a fixed-gain power amplifier 652. The output from the power amplifier can be broadcast from the wireless device.

The amplitude detector 200, 300, or 400 can be connected to different points of the circuit 600 to monitor and control the analog signal amplitude/power levels at different points in the circuit. For example, the amplitude detector 200, 300, or 400 can be connected through a multiplexer 660 to measure the amplified outputs of the local oscillator or to measure the amplitude of the received signal after it has been amplified by the low noise amplifier 620. The amplitude detector can also measure the rf power level of the broadcast power after the power amplifier 652.

In one implementation, circuits 200, 300, or 400 can be used within a transceiver (e.g., in a wireless system-on-a-chip device) to calibrate a signal from a receiver/transmitter chain. The circuits can be connected to different points in the transceiver and used to monitor the amplitude of an analog sinusoidal signal inside the chip at the different points to determine if different components of the chain behave as the expected. This information then can be used to tune the gain of amplifiers of various amplifiers within the transceiver with inductor loads. This information also can be used to tune the gain of low-frequency blocks within the transceiver to make all chips of a particular design have identical gain settings. When used to measure the amplitude of an rf signal at the output antenna of the transceiver, the measured amplitude can be used along with the known impedance of the antenna to determine output power of the transmitter.

While certain features of the described implementations have been illustrated as described herein, modifications, substitutions, and changes can be made. Accordingly, other implementations are within scope of the following claims.

What is claimed is:

1. A circuit comprising:
   a first transistor and a second transistor arranged to form a current mirror, gates of the transistors of the current mirror being operatively coupled, and a drain of the first transistor of the current mirror being operatively coupled to the gate of the first transistor of the current mirror;
   at least two transistors operatively coupled to the current mirror, wherein the transistors are arranged to form a differential pair amplifier, wherein a drain of each of the two transistors arranged to form the differential pair is operatively coupled to a drain of a first transistor of the current mirror; and
   a follower transistor operatively coupled to the current mirror and to the differential pair,
   wherein the transistors of the differential pair, the current mirror, and the follower transistor are operatively coupled such that during operation an amplitude of a signal output from the follower transistor is proportional to an amplitude of an signal input into the differential pair.

2. The circuit of claim 1, wherein the transistors are MOS-type transistors.

3. The circuit of claim 1, wherein the transistors are BJT-type transistors.

4. The circuit of claim 1, wherein
   a drain of a second transistor of the current mirror is operatively coupled to a drain of the follower transistor, and wherein
   the drain of the follower transistor is operatively coupled to a gate of the follower transistor.

5. The circuit of claim 4, wherein sources of the transistors that form the differential pair are operatively coupled to a source of the follower transistor.

6. The circuit of claim 5, further comprising a current source operatively coupled to the sources of the transistors that form the differential pair and to the source of the follower transistor.

7. The circuit of claim 1, further comprising a capacitor operatively coupled to an input of the differential pair and wherein during operation an input signal is AC-coupled to a gate of a transistor of the differential pair through the capacitor.

8. The circuit of claim 7, wherein a frequency of the input signal is greater than 1 GHz.

9. The circuit of claim 1, further comprising a voltage divider operatively coupled to an input of the differential pair, wherein the voltage divider is configured for reducing an amplitude of an input signal coupled to a gate of a transistor of the differential pair.

10. The circuit of claim 1, further comprising a low-pass filter operatively coupled to the follower transistor, wherein the low-pass filter is configured for passing a low-frequency component of a signal output from the follower transistor.

11. The circuit of claim 1, further comprising a voltage source configured for adding a bias voltage to the signal input into the differential pair.

12. The circuit of claim 1, further comprising a multiplexer configured for operatively coupling the transistors of the differential pair to different nodes within a wireless transceiver device, and wherein the circuit is located within a chip containing the wireless transceiver.

13. A circuit comprising:
    at least two transistors arranged to form a current mirror;
    a third transistor and a fourth transistor operatively coupled to the current mirror, wherein the third and fourth transistors are arranged to form a differential pair amplifier and wherein a drain of each of the two transistors arranged to form the differential pair is operatively coupled to a drain of a first transistor of the current mirror; and
    a follower transistor operatively coupled to the current mirror and to the differential pair,
    wherein the transistors of the differential pair, the current mirror, and the follower transistor are operatively coupled such that during operation an amplitude of a signal output from the follower transistor is proportional to an amplitude of an signal input into the third transistor, while a DC signal is input into the fourth transistor.

14. The circuit of claim 13, wherein
    drains of the third and fourth transistors are operatively coupled to a drain of a first transistor of the current mirror, wherein
    gates of the transistors of the current mirror are operatively coupled, wherein,
    a drain of the first transistor of the current mirror is operatively coupled to the gate of the first transistor, wherein
    a drain of a second transistor of the current mirror is operatively coupled to a drain of the follower transistor, and wherein
    the drain of the follower transistor is operatively coupled to a gate of the follower transistor.

15. The circuit of claim 14, further comprising a current source and wherein sources of the third transistor, the fourth transistor, and the follower transistor are operatively coupled to each other and to the current source.

16. The circuit of claim 13, further comprising a capacitor operatively coupled to the third transistor, wherein during operation the input signal is AC-coupled to a gate of the input transistor through the capacitor.

17. The circuit of claim 13, further comprising a voltage divider operatively coupled to an input of the third transistor, wherein the voltage divider is configured for reducing an amplitude of an input signal coupled to a gate of third transistor.

18. The circuit of claim 13, further comprising a low-pass filter operatively coupled to the follower transistor, wherein the low-pass filter is configured for passing a low-frequency component of a signal output from the follower transistor.

19. The circuit of claim 13, further comprising a multiplexer configured for operatively coupling the third transistor to different nodes within a wireless transceiver device, and wherein the circuit is located within a chip containing the wireless transceiver.

* * * * *